United States Patent
Chattopadhyay et al.

(10) Patent No.: US 9,509,319 B1
(45) Date of Patent: Nov. 29, 2016

(54) CLOCK AND DATA RECOVERY CIRCUIT

(71) Applicant: SILAB TECH PVT. LTD., Bengaluru, Karnataka (IN)

(72) Inventors: Biman Chattopadhyay, Bengaluru (IN); Ravi Mehta, Bengaluru (IN); Gopal Krishna Ullal Nayak, Bengaluru (IN); Sharath Bhat N, Bengaluru (IN)

(73) Assignee: SILAB TECH PVT. LTD., Bengaluru (IN)

( * ) Notice: Subject to any disclaimer, the term of this patent is extended or adjusted under 35 U.S.C. 154(b) by 0 days.

(21) Appl. No.: 15/138,758

(22) Filed: Apr. 26, 2016

(51) Int. Cl.
| | |
|---|---|
| *H03L 7/08* | (2006.01) |
| *H03L 7/087* | (2006.01) |
| *H03M 1/66* | (2006.01) |
| *H04L 7/04* | (2006.01) |

(52) U.S. Cl.
CPC ............. *H03L 7/0807* (2013.01); *H03L 7/087* (2013.01); *H03M 1/66* (2013.01); *H04L 7/04* (2013.01)

(58) Field of Classification Search
CPC ...... H03L 7/0807; H03L 7/087; H03M 1/66; H04L 7/04
USPC .......................... 375/354, 373, 374, 375, 376
See application file for complete search history.

(56) References Cited

U.S. PATENT DOCUMENTS

| | | | | |
|---|---|---|---|---|
| 7,092,472 | B2 * | 8/2006 | Stojanovic | H04L 7/0334 375/371 |
| 7,254,173 | B1 * | 8/2007 | Fu | H04L 25/0272 375/233 |
| 2003/0194083 | A1 * | 10/2003 | Scott | H04L 25/0266 379/413.02 |
| 2007/0040723 | A1 * | 2/2007 | Snoeijs | H03M 1/38 341/172 |
| 2007/0047689 | A1 * | 3/2007 | Menolfi | H03D 3/006 375/376 |
| 2008/0253492 | A1 * | 10/2008 | Wang | H03K 3/0315 375/376 |
| 2009/0195281 | A1 * | 8/2009 | Tamura | G11C 7/1072 327/163 |
| 2015/0349944 | A1 * | 12/2015 | Werker | H03L 7/0807 375/371 |

* cited by examiner

*Primary Examiner* — Freshteh N Aghdam
(74) *Attorney, Agent, or Firm* — Sughrue Mion, PLLC

(57) ABSTRACT

A clock and data recovery (CDR) circuit that receives an input signal and generates clock and sampled output signals includes a phase-frequency detector (PFD) circuit, a control circuit, a digital-to-analog converter (DAC), a current-controlled oscillator (CCO) and a data sampler. The PFD generates intermediate and fine digital control signals. The DAC receives the intermediate digital control signal as a coarse digital control signal and the fine digital control signal and generates an output current. The CCO receives the output current and generates the clock signal. The coarse digital control signal is used to coarse calibrate a frequency of the clock signal and the fine digital control signal is used to fine calibrate the frequency of the clock signal. The data sampler receives the clock signal and samples the input signal at the frequency of the clock signal to generate the sampled output signal.

22 Claims, 2 Drawing Sheets

CLOCK AND DATA RECOVERY CIRCUIT

PREAMBLE TO THE DESCRIPTION

The following specification particularly describes the nature of this invention.

BACKGROUND

1. Field of the Invention

The present invention generally relates to integrated circuits, and, more particularly to a clock and data recovery circuit.

2. Description of the Related Art

A clock and data recovery (CDR) circuit is commonly used in a high speed data communication system. Generally, the high speed data communication system receives an input signal without an accompanying clock signal. An absence of the accompanying clock signal may result in undersampling or oversampling of the input signal. Thus, a CDR circuit is used in the high speed data communication system to generate a clock signal at a frequency that is equal to the frequency of the input signal. Further, the clock signal samples the input signal at the frequency of the clock signal.

Typically, a conventional CDR circuit includes a phase-frequency detector (PFD) circuit, a digital-to-analog converter (DAC), an oscillator, and a data sampler. The PFD circuit determines a frequency difference between a frequency of a reference clock signal and a frequency of the clock signal, and generates a digital control signal (also referred to as a "frequency lock mode"). The frequency of the reference clock signal is equal to the frequency of the input signal or multiples of the frequencies of the input signal.

The DAC includes multiple current sources and switches. The DAC is connected to the PFD circuit to receive the digital control signal. The digital control signal selects the multiple current sources by controlling their corresponding switches. Thus, the DAC outputs an output current based on the digital control signal. The oscillator is connected to the DAC to receive the output current and generate the clock signal. As the oscillator generates the clock signal based on the reference clock signal, the frequency of the clock signal is equal to the frequency thereof. Thus, the frequency of the clock signal is locked at the frequency of the reference clock signal (i.e., the frequency of the input signal).

After locking the frequency of the clock signal, the PFD circuit detects a phase difference between a phase of the input signal and a phase of the clock signal (also referred to as a "phase lock mode"). The digital control signal varies based on the detected phase difference, and in turn modulates the phase of the clock signal. Thus, the phase of the clock signal is locked at the phase of the input signal. The data sampler is connected to the oscillator to receive the clock signal, and samples the input signal at the frequency of the clock signal.

The frequency of the clock signal depends on the output current which in turn depends on a step size of the DAC. The step size of the DAC indicates a fractional change of the frequency of the clock signal corresponding to a bit change of the digital control signal (also known as "parts per million frequency step size" or "ppm frequency step size"). Further, the ppm frequency step size depends on the bias current and the frequency of the clock signal. For a constant output current, the frequency of the clock signal may vary with variation in temperature. Further, the bias current varies significantly with process-voltage-temperature (PVT) variations. Thus, the ppm frequency step size varies significantly with the PVT variations. Moreover, a variation in the ppm frequency step size results in the variation of the range of the output current that the DAC can provide to the oscillator. Thus, for generating the clock signal with the frequency and phase equal to the frequency and phase of the input signal, the variation in the ppm frequency step size is undesirable. Such a DAC, when used in the CDR circuit, may provide inaccurate frequency of the clock signal, leading to undersampling or oversampling of the input signal.

A known technique to overcome the aforementioned problem is to increase or decrease the step size of the DAC. However, a DAC with a small step size includes a large number of current sources and switches to adjust the output current accurately based on the digital control signal. Thus, a decrease in the step size increases the size and complexity of the DAC. A DAC with a large step size includes a small number of current sources and switches.

However, such a DAC provides a large change in frequency with one bit change in the digital control signal. Further, the current requirement by the current sources in such DAC increases with increase in the step size of the DAC, thereby leading to poor power supply rejection. Thus, a DAC with an optimum step size and constant ppm frequency step size is required for the CDR circuit to generate the clock signal at a frequency equal to the frequency of the reference clock signal or a multiple of the frequency of the reference clock signal.

Therefore, it would be advantageous to have a CDR circuit that generates the clock signal that is independent of bias current and PVT variations, maintains a constant ppm frequency step size, and that overcomes the above-mentioned limitations of the conventional CDR circuit.

BRIEF DESCRIPTION OF DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF EMBODIMENTS

Figure 1:
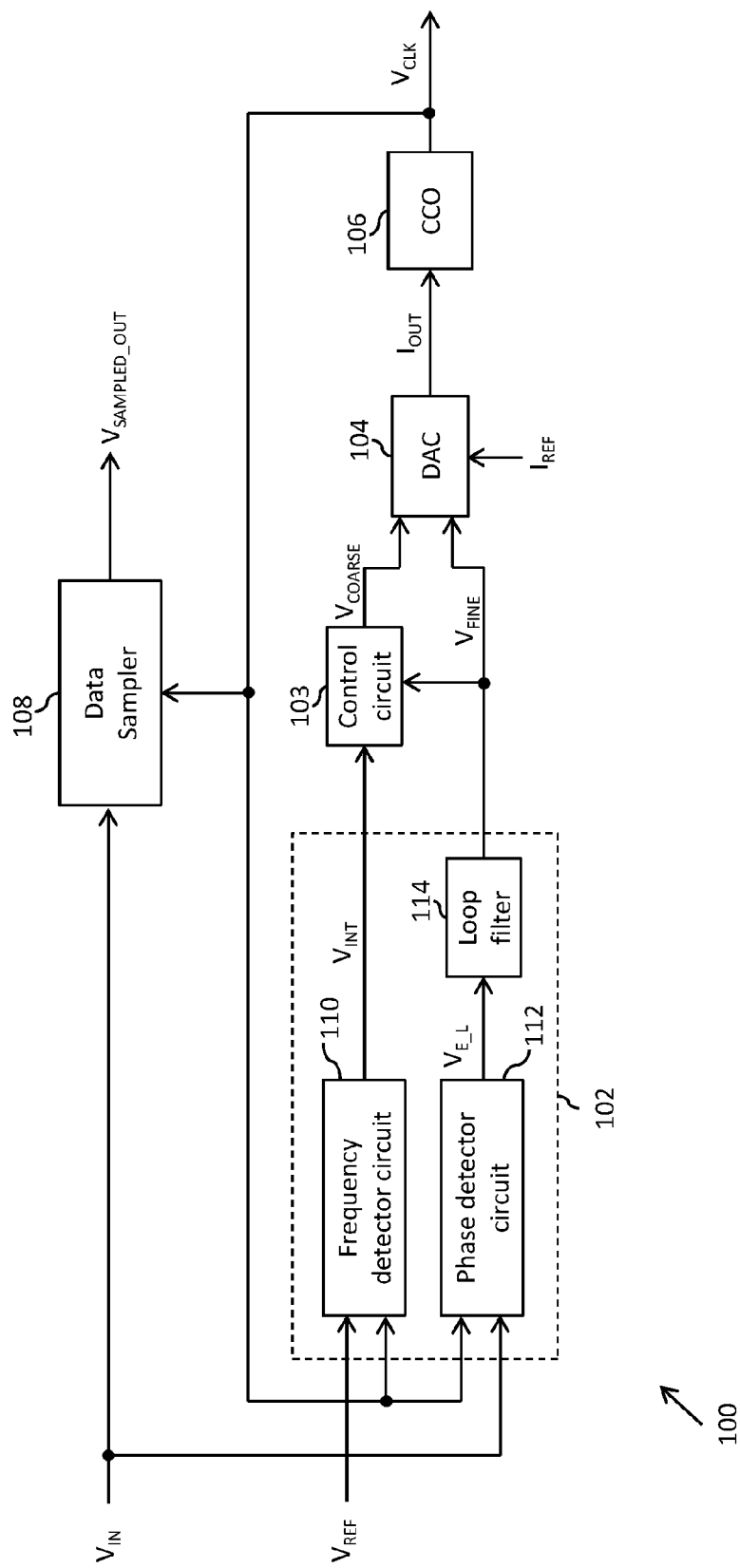
FIG. 1 is a schematic block diagram of a clock and data recovery (CDR) circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present.

In an embodiment of the present invention, a digital-to-analog converter (DAC) for generating an output current based on coarse and fine digital control signals is provided. The DAC includes a first transistor, a sink circuit, and a source circuit. The sink circuit includes second and third transistors and first and second switches. The DAC further includes fourth and fifth transistors. The source circuit includes sixth and seventh transistors and third and fourth switches. The first transistor has a drain terminal that receives a reference current, a gate terminal that is connected to its drain terminal, and a source terminal that is connected to ground. The sink circuit receives the coarse digital control signal, and is connected to the gate terminal of the first transistor to receive the reference current and generate a bias current. The second transistor has a gate terminal that is connected to the gate terminal of the first transistor, a drain terminal that mirrors the reference current and generates a first sink current, and a source terminal that is connected to ground. The third transistor has a gate terminal that is connected to the gate terminal of the first transistor, a drain terminal that mirrors the reference current and generates a second sink current, and a source terminal that is connected to ground. The first and second switches receive the coarse digital control signal. The first switch is connected to the drain terminal of the second transistor to receive the first sink current. The second switch is connected to the drain terminal of the third transistor to receive the second sink current. The first and second sink currents flow through the first and second switches, respectively, based on the coarse digital control signal. The bias current is equal to a sum of the first and second sink currents. The fourth transistor has a drain terminal that is connected to its gate terminal, and a source terminal that is connected to a supply voltage. The fourth transistor is further connected to the sink circuit to receive the bias current. The fifth transistor has a gate terminal that is connected to the gate terminal of the fourth transistor, and a source terminal, connected to the supply voltage to mirror a first fraction of the bias current and generate a first source current. The source circuit receives the fine digital control signal, and is connected to the gate terminal of the fourth transistor to receive the bias current. The source circuit mirrors a second fraction of the bias current, and generates the output current. The sixth transistor has a gate terminal that is connected to the gate terminal of the fourth transistor, and a source terminal that is connected to the supply voltage to mirror the second fraction of the bias current, and generates a second source current. The seventh transistor has a gate terminal that is connected to the gate terminal of the fourth transistor, and a source terminal that is connected to the supply voltage to mirror the second fraction of the bias current and generates a third source current. The third and fourth switches receive the fine digital control signal. The third and fourth switches are connected to the drain terminals of the sixth and seventh transistors to receive the second and third source currents, respectively. The second and third source currents flow through the third and fourth switches, respectively, based on the fine digital control signal. The output current is equal to a sum of the first through third source currents, and is output at a node formed by a drain terminal of the fifth transistor and the third and fourth switches.

In another embodiment of the present invention, a clock and data recovery circuit (CDR) is provided. The CDR circuit includes a phase-frequency detector (PFD) circuit, a digital-to-analog converter (DAC), a current-controlled-oscillator (CCO) and a data sampler. The PFD circuit receives an input signal, a clock signal, and a reference signal. The PFD circuit generates intermediate and fine digital control signals based on a frequency difference between a frequency of the reference signal and a frequency of the clock signal, and a phase difference between a phase of the input signal and a phase of the clock signal, respectively. The DAC includes a first transistor and sink and source circuits. The sink circuit includes second and third transistors and first and second switches. The DAC further includes fourth and fifth transistors. The source circuit includes sixth and seventh transistors and third and fourth switches. The first transistor has a drain terminal that receives a reference current, a gate terminal that is connected to its drain terminal, and a source terminal that is connected to ground. The sink circuit receives a coarse digital control signal and is connected to the gate terminal of the first transistor to receive the reference current and generate a bias current. The coarse digital control signal is at least one of the intermediate digital control signal, an incremented version of the intermediate digital control signal, and a decremented version of the intermediate digital control signal. The second transistor has a gate terminal that is connected to the gate terminal of the first transistor, a drain terminal that mirrors the reference current and generates a first sink current, and a source terminal that is connected to ground. The third transistor has a gate terminal that is connected to the gate terminal of the first transistor, a drain terminal that mirrors the reference current and generates a second sink current, and a source terminal that is connected to ground. The first and second switches receive the coarse digital control signal. The first switch is connected to the drain terminal of the second transistor to receive the first sink current. The second switch is connected to the drain terminal of the third transistor to receive the second sink current. The first and second sink currents flow through the first and second switches, respectively, based on the coarse digital control signal. The bias current is equal to a sum of the first and second sink currents. The fourth transistor has a drain terminal that is connected to its gate terminal and a source terminal that is connected to a supply voltage. The fourth transistor is further connected to the sink circuit to receive the bias current. The fifth transistor has a gate terminal that is connected to the gate terminal of the fourth transistor, and a source terminal that is connected to the supply voltage to mirror a first fraction of the bias current and generates a first source current. The source circuit receives the fine digital control signal, and is connected to the gate terminal of the fourth transistor to receive the bias current. The source circuit mirrors a second fraction of the bias current, and generates the output current. The sixth transistor has a gate terminal that is connected to the gate terminal of the fourth transistor, and a source terminal that is connected to the supply voltage to mirror the second fraction of the bias current and generate a second source current. The seventh transistor has a gate terminal that is connected to the gate terminal of the fourth transistor, and a source terminal that is connected to the supply voltage, to mirror the second fraction of the bias current and generate a third source current. The third and fourth switches receive the fine digital control signal. The third and fourth switches are connected to drain terminals of the sixth and seventh transistors to receive the second and third source currents, respectively. The second and third source currents flow through the third and fourth switches, respectively, based on the fine digital control signal. The output current is equal to a sum of the first through third source currents, and is output at a node formed by a drain terminal of the fifth transistor and the third and fourth switches. The CCO receives the output current and generates the clock signal. The data sampler receives the input signal and the clock signal and samples the input signal at the frequency of the clock signal to generate a sampled output signal.

Various embodiments of the present invention provide a digital-to-analog converter (DAC), for generating an output current based on coarse and fine digital control signals. The DAC includes a first transistor, a sink circuit, and a source circuit. A drain terminal of the first transistor receives a reference current and a source terminal thereof is connected to ground. The sink circuit receives the reference current and the coarse digital control signal. The sink circuit includes second and third transistors and first and second switches. Gate terminals of the second and third transistors are connected to the gate terminal of the first transistor, and source terminals of the second and third transistors are connected to ground. A drain terminal of the second transistor mirrors the reference current to generate a first sink current.

Similarly, a drain terminal of the second transistor mirrors the reference current to generate a second sink current. The first and second switches receive the coarse digital control signal to allow the first and second sink currents to flow through the drain terminals of the second and third transistors, respectively. The DAC further includes fourth and fifth transistors. A drain terminal of the fourth transistor is connected to its gate terminal to receive a bias current which is a sum of the first and second sink currents. Source terminals of the fourth and fifth transistors are connected to a supply voltage. The source terminal of the fifth transistor mirrors a first fraction of the bias current to generate a first source current. The source circuit receives the fine digital control signal and mirrors a second fraction of the bias current. The source circuit includes sixth and seventh transistors and third and fourth switches. Source terminals of the sixth and seventh transistors mirror the second fraction of the bias current to generate second and third source currents, respectively. The third and fourth switches receive the fine digital control signal to allow the second and third source currents to flow through drain terminals of the sixth and seventh transistors, respectively. The output current is output at a node formed by a drain terminal of the fifth transistor and the third and fourth switches.

As the first fraction of the bias current is the major fraction of the bias current and the second fraction is the minor fraction of the bias current, the sink circuit is used to coarse calibrate the output current and the source circuit is used to fine calibrate the output current. After the sink circuit completes the coarse calibration of the output current, the bias current is constant, thereby maintaining a constant step size of the source circuit. Further, adjusting the coarse digital control signal ensures a constant ppm step size of the DAC. Further, the step size of the source circuit is unaffected by the process-voltage-temperature (PVT) variations. Moreover, the DAC size is considerably less than a size of a single DAC with a small step size. Thus, the optimum sized DAC is easy to design and does not have poor power supply rejection.

Further, a current-controlled oscillator receives the output current to generate a clock signal. As the step size of the source circuit remains constant after an initial frequency lock mode i.e., independent of the PVT variation and the variation in the reference current, the clock and data recovery (CDR) circuit makes minor modifications to the fine digital control signal to maintain a constant frequency and phase relationship of the clock signal with the reference signal.

Referring now to FIG. 1, a schematic block diagram of a clock and data recovery (CDR) circuit 100 in accordance with an embodiment of the present invention is shown. The CDR circuit 100 includes a phase-frequency detector (PFD) circuit 102, a control circuit 103, a digital-to-analog converter (DAC) 104, a current-controlled oscillator (CCO) 106, and a data sampler 108. The PFD circuit 102 includes a frequency detector circuit 110, a phase detector circuit 112, and a loop filter 114.

The PFD circuit 102 is connected to the CCO 106 to receive a clock signal ($V_{CLK}$). The PFD circuit 102 also receives an input signal ($V_{IN}$) and a reference signal ($V_{REF}$), and generates intermediate and fine digital control signals ($V_{INT}$ and $V_{FINE}$). In one embodiment, a local crystal oscillator (not shown) generates the reference signal ($V_{REF}$) at a frequency equal to the frequency of the input signal ($V_{IN}$). In another embodiment, the local crystal oscillator generates the reference signal ($V_{REF}$) at a frequency equal to a multiple of the frequency of the input signal ($V_{IN}$). In yet another embodiment, the local crystal oscillator generates the reference signal ($V_{REF}$) at a frequency equal to a sub-multiple of the frequency of the input signal ($V_{IN}$).

The method of comparing either of the multiple or the sub-multiple of the frequency of the input signal with the frequency of the reference signal ($V_{REF}$) is well known in the art. The frequency detector circuit 110 generates the intermediate digital control signal ($V_{INT}$) based on a difference between frequencies of the reference and clock signals ($V_{REF}$ and $V_{CLK}$). The phase detector circuit 112 generates an early-late signal ($V_{E\_L}$) based on a phase difference between phases of the input and clock signals ($V_{IN}$ and $V_{CLK}$).

When the clock signal ($V_{CLK}$) leads the input signal ($V_{IN}$), the early-late signal ($V_{E\_L}$) is generated at a first value and when the clock signal ($V_{CLK}$) lags the input signal ($V_{IN}$), the early-late signal ($V_{E\_L}$) is generated at a second value. In the absence of a transition of the input signal ($V_{IN}$), the early-late signal ($V_{E\_L}$) is generated at a third value. In an example, the first and second values are "00" and "11", respectively. The third value is at least one of "10" and "01". When the clock signal ($V_{CLK}$) leads the input signal ($V_{IN}$), the value of the early-late signal ($V_{E\_L}$) is set to "00" and when the clock signal ($V_{CLK}$) lags the input signal ($V_{IN}$), the value of the early-late signal ($V_{E\_L}$) is set to "11". In the absence of the transition of the input signal ($V_{IN}$), the value of the early-late signal ($V_{E\_L}$) is set to "10" or "01".

In the presently preferred embodiment, the phase detector circuit 112 is a bang-bang detector that samples the input signal ($V_{IN}$) and detects a transition in the input signal ($V_{IN}$). The structure and function of the bang-bang detector is well known in the art. The phase detector circuit 112 determines whether a sampling edge of the clock signal ($V_{CLK}$) leads or lags a transition edge of the input signal ($V_{IN}$) and generates the early-late signal ($V_{E\_L}$). The phase detector circuit 112 generates the early-late signal ($V_{E\_L}$) at the first value when the sampling edge of the clock signal ($V_{CLK}$) leads the transition edge of the input signal ($V_{IN}$). The phase detector circuit 112 generates the early-late signal ($V_{E\_L}$) at the second value when the sampling edge of the clock signal ($V_{CLK}$) lags the transition edge of the input signal ($V_{IN}$). The phase detector circuit 112 generates the early-late signal ($V_{E\_L}$) at the third value in the absence of transition in the input signal ($V_{IN}$). It will be understood by those with skill in the art that the phase detector circuit 112 is not restricted to the use of bang-bang detector. Various types of phase detector circuits known in the art may be used to detect the phase difference between the phases of the input and clock signals ($V_{IN}$ and $V_{CLK}$).

The loop filter 114 is connected to the phase detector circuit 112 to receive the early-late signal ($V_{E\_L}$) and generate the fine digital control signal ($V_{FINE}$). In one embodiment, the loop filter 114 includes first and second counters. When the early-late signal ($V_{E\_L}$) is generated at the first value, a count value of the first counter is incremented by one, and when the early-late signal ($V_{E\_L}$) is generated at the second value, a count value of the second counter is incremented by one. The loop filter 114 further includes a subtractor circuit that calculates a difference between the count values of the first and second counters. When the difference between the count values of the first and second counters is greater than a predetermined threshold count value, the loop filter 114 updates the fine digital control signal ($V_{FINE}$). The fine digital control signal ($V_{FINE}$) has predetermined maximum and minimum values.

In another embodiment of the present invention, the loop filter 114 includes an up-down counter. When the early-late signal ($V_{E\_L}$) is generated at the first value, a count value of the up-down counter is incremented by one, and when the early-late signal ($V_{E\_L}$) is generated at the second value, the count value of the up-down counter is decremented by one. When the count value of the up-down counter is greater than a predetermined threshold count value, the loop filter 114 updates the fine digital control signal ($V_{FINE}$).

The control circuit 103 is connected to the frequency detector circuit 110 and the loop filter 114 to receive the intermediate digital control signal ($V_{INT}$) and the fine digital control signal ($V_{FINE}$), respectively. The control circuit 103 generates a coarse digital control signal ($V_{COARSE}$). During a frequency lock mode (i.e. when the PFD circuit 102 determines a frequency difference between frequencies of reference and clock signals ($V_{REF}$ and $V_{CLK}$), and generates the intermediate digital control signal ($V_{INT}$)), the control circuit 103 provides the intermediate digital control signal ($V_{INT}$) as the coarse digital control signal ($V_{COARSE}$). During a phase lock mode (i.e. when the PFD circuit 102 determines a phase difference between phases of the input and clock signals ($V_{IN}$ and $V_{CLK}$), and generates the fine digital control signal ($V_{FINE}$)), when the fine digital control signal ($V_{FINE}$) is less than a first threshold value, the control circuit 103 decrements the intermediate digital control signal ($V_{INT}$) by a first update value to generate the coarse digital control signal ($V_{COARSE}$) (also referred to as the "decremented version of the intermediate digital control signal ($V_{INT}$)"). When the fine digital control signal ($V_{FINE}$) is greater than a second threshold value, the control circuit 103 increments the intermediate digital control signal ($V_{INT}$) by the first update value to generate the coarse digital control signal ($V_{COARSE}$) (also referred to as the "incremented version of the intermediate digital control signal ($V_{INT}$)").

The DAC 104 is connected to the PFD circuit 102 and the control circuit 103 to receive the fine and coarse digital control signals ($V_{FINE}$ and $V_{COARSE}$), respectively. The DAC 104 further receives a reference current ($I_{REF}$) and generates an output current ($I_{OUT}$) based on the fine and coarse digital control signals ($V_{FINE}$ and $V_{COARSE}$) and the reference current ($I_{REF}$). The CCO 106 is connected to the DAC 104 to receive the output current ($I_{OUT}$) and generate the clock signal ($V_{CLK}$). The data sampler 108 is connected to the CCO 106 to receive the clock signal ($V_{CLK}$). The data sampler 108 further receives the input signal ($V_{IN}$) and samples the input signal ($V_{IN}$) at the frequency of the clock signal ($V_{CLK}$) to generate a sampled output signal ($V_{SAMPLED\_OUT}$). In one embodiment, the data sampler 108 is a D flip-flop.

In another embodiment, the phase detector circuit 112 includes the data sampler 108. The phase detector circuit 112 receives the input signal ($V_{IN}$) and the clock signal ($V_{CLK}$). The phase detector circuit 112 samples the input signal ($V_{IN}$) at a frequency equal to the frequency of the clock signal ($V_{CLK}$) to generate the sampled output signal ($V_{SAMPLED\_OUT}$).

In the presently preferred embodiment, the CCO 106 is a ring oscillator that generates the clock signal ($V_{CLK}$) at four phases with a predetermined phase difference between them. The frequency of the clock signal ($V_{CLK}$) is approximately half the frequency of the input signal ($V_{IN}$), thus, the clock signal ($V_{CLK}$) is used by the data sampler 108 to sample the input signal ($V_{IN}$) at a rate approximately half the rate of the input signal ($V_{IN}$). In an alternate embodiment, the ring oscillator may generate the clock signal ($V_{CLK}$) at a frequency which is not equal to half the frequency of the input signal ($V_{IN}$).

Figure 2:
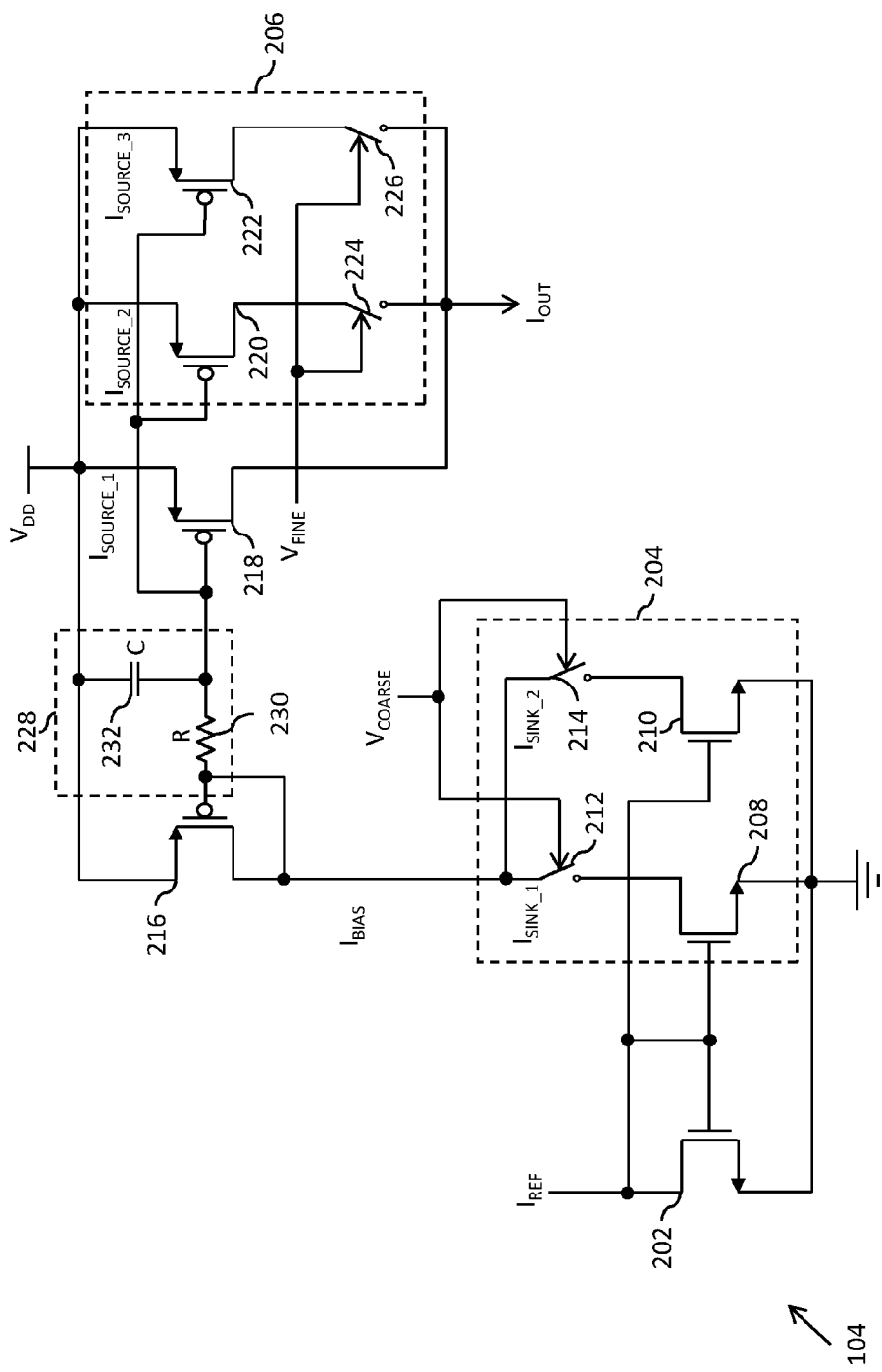
FIG. 2 is a schematic circuit diagram of a digital-to-analog converter (DAC) of the CDR circuit of FIG. 1 in accordance with an embodiment of the present invention.

Referring now to FIG. 2, a schematic circuit diagram of the digital-to-analog converter (DAC) 104 of the CDR circuit 100 of FIG. 1 in accordance with an embodiment of the present invention is shown. The DAC 104 includes a first transistor 202, a sink circuit 204, and a source circuit 206.

A drain terminal of the first transistor 202 receives the reference current ($I_{REF}$) from a reference current generator (not shown). A gate terminal of the first transistor 202 is connected to a drain terminal thereof, and a source terminal thereof is connected to ground.

The sink circuit 204 essentially functions as a digital-to-analog converter. The sink circuit 204 receives the coarse digital control signal ($V_{COARSE}$), and is connected to the first transistor 202 to receive the reference current ($I_{REF}$) and generate the bias current ($I_{BIAS}$). The reference current ($I_{REF}$) determines a step size of the sink circuit 204. The sink circuit 204 includes second and third transistors 208 and 210 and first and second switches 212 and 214. In presently preferred embodiment, the second and third transistors 208 and 210 are n-channel metal-oxide semiconductor (NMOS) transistors.

Gate terminals of the second and third transistors 208 and 210 are connected to the gate terminal of the first transistor 202 and source terminals of the second and third transistors 208 and 210 are connected to ground. A drain terminal of the second transistor 208 mirrors the reference current ($I_{REF}$) to generate the first sink current a ($I_{SINK\_1}$). A drain terminal of the third transistor 210 mirrors the reference current to generate the second sink current ($I_{SINK\_2}$). In an embodiment, the second and third transistors 208 and 210 are binary weighted transistors. In another embodiment, the second and third transistors 208 and 210 are thermometric transistors (i.e., the first sink current a ($I_{SINK\_1}$) flowing through the second transistor 208 is equal to the second sink current ($I_{SINK\_2}$) flowing through the third transistor 210).

The first and second switches 212 and 214 receive the coarse digital control signal ($V_{COARSE}$). The first switch 212 is connected to the drain terminal of the second transistor 208 to receive the first sink current ($I_{SINK\_1}$). The second switch 214 is connected to the drain terminal of the third transistor 210 to receive the second sink current ($I_{SINK\_2}$). The first switch 212 is controlled by a first bit of the coarse digital control signal ($V_{COARSE}$) and is in a closed position when the first bit is activated. The second switch 214 is controlled by a second bit of the coarse digital control signal ($V_{COARSE}$) and is in a closed position when the second bit is activated. Thus, the first and second sink currents ($I_{SINK\_1}$ and $I_{SINK\_2}$) flow through the drain terminals of the second and third transistors 208 and 210, respectively, based on the coarse digital control signal ($V_{COARSE}$).

The DAC 104 further includes fourth and fifth transistors 216 and 218. A drain terminal of the fourth transistor 216 is connected to its gate terminal and the drain terminals of the second and third transistors 208 and 210 by way of the first and second switches 212 and 214, respectively. The drain terminal of the fourth transistor 216 receives a bias current ($I_{BIAS}$) which is a sum of the first and second sink currents ($I_{SINK\_1}$ and $I_{SINK\_2}$). A gate terminal of the fifth transistor 218 is connected to the gate terminal of the fourth transistor 216. A source terminal of the fifth transistor 218 is connected to a supply voltage ($V_{DD}$) to mirror a first fraction of the bias current ($I_{BIAS}$) and generate a first source current ($I_{SOURCE\_1}$).

The source circuit 206 also functions as a digital-to-analog converter that is connected to the gate terminal of the fourth transistor 216 and the supply voltage ($V_{DD}$). The source circuit 206 receives the fine digital control signal ($V_{FINE}$) and is connected to the sink circuit 204 to receive the bias current ($I_{BIAS}$). The source circuit 206 mirrors a second fraction of the bias current ($I_{BIAS}$) to generate second and third source currents ($I_{SOURCE\_2}$ and $I_{SOURCE\_3}$). The bias current ($I_{BIAS}$) defines a step size of the source circuit 206. The source circuit 206 includes sixth and seventh transistors 220 and 222 and third and fourth switches 224 and 226. In the presently preferred embodiment, the fourth through seventh 216-222 transistors are p-channel metal-oxide semiconductor (PMOS) transistors.

Gate terminals of the sixth and seventh transistors 220 and 222 are connected to the gate terminal of the fourth transistor 216. Source terminals of the sixth and seventh transistors 220 and 222 are connected to the supply voltage ($V_{DD}$). The source terminal of the sixth transistor 220 mirrors the bias current ($I_{BIAS}$) to generate the second source current ($I_{SOURCE\_2}$). The source terminal of the seventh transistor 222 mirrors the bias current ($I_{BIAS}$) to generate the third source current ($I_{SOURCE\_3}$). In an embodiment, the sixth and seventh transistors 220 and 222 are binary weighted transistors. In another embodiment, the sixth and seventh transistors 220 and 222 are thermometric transistors (i.e., the second source current ($I_{SOURCE\_2}$) flowing through the sixth transistor 220 is equal to the third source current ($I_{SOURCE\_3}$) flowing through the seventh transistor 222).

The third and fourth switches 224 and 226 receive the fine digital control signal ($V_{FINE}$). The third switch 224 is connected to the drain terminal of the sixth transistor 220 to receive the second source current ($I_{SOURCE\_2}$). The fourth switch 226 is connected to the drain terminal of the seventh transistor 222 to receive the third source current ($I_{SOURCE\_3}$). The third switch 224 is controlled by a first bit of the fine digital control signal ($V_{FINE}$) and is in a closed position when the first bit is activated. The fourth switch 226 is controlled by a second bit of the fine digital control signal ($V_{FINE}$) and is in the closed position when the second bit is activated. Thus, the second and third source currents ($I_{SOURCE\_2}$ and $I_{SOURCE\_3}$) flow through the drain terminals of the sixth and seventh transistors 220 and 222, respectively, based on the fine digital control signal ($V_{FINE}$). The output current ($I_{OUT}$) is output at a node formed by the drain terminal of the fifth transistor 218 and the third and fourth switches 224 and 226.

Further, it will be understood by those with skill in the art that the invention is not restricted to the use of only two transistors and switches each in the sink and source circuits 204 and 206. The sink and source circuits 204 and 206 each may include a large number of transistors and switches in the form arrays of transistors and switches. The array of transistors is connected to the respective array of switches.

In one embodiment of the present invention, the DAC 104 includes a low-pass filter 228 connected between the gate terminals of the fourth and fifth transistors 216 and 218. In the present embodiment, the low-pass filter 228 includes a resistor 230 and a capacitor 232. The resistor 230 is connected between the gate terminals of the fourth and fifth transistors 216 and 218. The capacitor 232 is connected between the supply voltage and the gate terminal of the fifth transistor 218. The low-pass filter 228 avoids noise and transient transmitted by the sink circuit 204.

In operation, the PFD circuit 102 receives the input signal ($V_{IN}$), the clock signal ($V_{CLK}$) and the reference signal ($V_{REF}$). During power up, the fine digital control signal ($V_{FINE}$) is set to a predetermined digital value. In an embodiment, for an N-bit DAC, the predetermined digital value is calculated as $2^N/2$. The frequency detector circuit 110 determines a difference between the frequencies of the clock signal ($V_{CLK}$) and the reference signal ($V_{REF}$) and generates the coarse digital control signal ($V_{COARSE}$). The coarse digital control signal ($V_{COARSE}$) controls the first and second switches 212 and 214, thereby varying the bias current ($I_{BIAS}$) flowing through the drain terminal of the fourth transistor 216. The source terminal of the fifth transistor 218 mirrors the first fraction of the bias current ($I_{BIAS}$) and the source circuit 206 mirrors the second fraction of the bias current ($I_{BIAS}$). The output current ($I_{OUT}$) is output at a node formed by the drain terminal of the fifth transistor 218 and the source circuit 206.

The CCO 106 receives the output current ($I_{OUT}$) and generates the clock signal ($V_{CLK}$). The first fraction of the bias current ($I_{BIAS}$) is greater than the second fraction of the bias current ($I_{BIAS}$). Thus, the first fraction of the bias current ($I_{BIAS}$) is used to coarse calibrate the frequency of the clock signal ($V_{CLK}$) and the second fraction of the bias current ($I_{BIAS}$) is used to fine calibrate the frequency of the clock signal ($V_{CLK}$). The frequency detector circuit 110 varies the coarse digital control signal ($V_{COARSE}$) till the frequency of the clock signal ($V_{CLK}$) is equal to the frequency of the reference signal ($V_{REF}$). The frequency of the clock signal ($V_{CLK}$) is locked to the frequency of the reference signal ($V_{REF}$). When the frequency of the clock signal ($V_{CLK}$) is locked to the frequency of the reference signal ($V_{REF}$), the coarse digital control signal ($V_{COARSE}$) and the bias current ($I_{BIAS}$) are held constant thereafter. Thus, the coarse calibration by the sink circuit 204 ensures that the step size of the source circuit 206 is pre-calibrated to the frequency of the clock signal ($V_{CLK}$).

When the frequency of the clock signal ($V_{CLK}$) is locked to the frequency of the reference signal ($V_{REF}$), the phase detector circuit 112 detects the phase difference between the phases of the input signal and the clock signal ($V_{IN}$ and $V_{CLK}$) and generates the fine digital control signal ($V_{FINE}$). The fine digital control signal ($V_{FINE}$) controls the third and fourth switches 224 and 226, thereby varying the second and third source currents ($I_{SOURCE\_2}$ and $I_{SOURCE\_3}$). Thus, the output current ($I_{OUT}$) varies with the fine digital control signal ($V_{FINE}$). The CCO 106 receives the output current and modulates the frequency of the clock signal ($V_{CLK}$) based on the fine digital control signal ($V_{FINE}$). Since the second and third source currents ($I_{SOURCE\_2}$ and $I_{SOURCE\_3}$) are mirrored versions of the second fraction of the bias current ($I_{BIAS}$), the fine digital control signal ($V_{FINE}$) fine calibrates the frequency of the clock signal ($V_{CLK}$).

When the reference current ($I_{REF}$) varies with the PVT variations, the sink circuit 204 updates the coarse digital control signal ($V_{COARSE}$) such that the bias current ($I_{BIAS}$) remains constant irrespective of the variation in the reference current ($I_{REF}$) in order to maintain the frequency of the clock signal ($V_{CLK}$) equal to the frequency of the reference signal ($V_{REF}$). Further, any variation in the frequency of the clock signal ($V_{CLK}$) is adjusted by the sink circuit 204 without any variation in the bias current ($I_{BIAS}$). Thus, for a constant bias current ($I_{BIAS}$), the ppm step size of the DAC 104 remains constant, irrespective of the variation in the reference current ($I_{REF}$) and the frequency of the clock signal ($V_{CLK}$).

For small variations of the frequency of the clock signal ($V_{CLK}$) due to temperature, the source circuit 206 updates the fine digital control signal ($V_{FINE}$) to fine calibrate the frequency of the clock signal ($V_{CLK}$). The source circuit 206 can vary the frequency of the clock signal ($V_{CLK}$) within a predetermined limited range of frequencies. When the variation in the bias current ($I_{BIAS}$) is significant due to temperature drift, the variation may exceed the predetermined limited range.

Thus, when the fine digital control signal ($V_{FINE}$) is less than a first threshold value, the control circuit 103 decrements the intermediate digital control signal ($V_{INT}$) by the first update value to generate the coarse digital control signal ($V_{COARSE}$). When the fine digital control signal ($V_{FINE}$) is greater than a second threshold value, the control circuit 103 increments the intermediate digital control signal ($V_{INT}$) by the first update value. In an example, when the fine digital control signal ($V_{FINE}$) is less than 5% of the predetermined maximum value of the fine digital control signal ($V_{FINE}$), the control circuit 103 decrements the intermediate digital control signal ($V_{INT}$) by one. When the fine digital control signal ($V_{FINE}$) is greater than 95% of the predetermined maximum value of the fine digital control signal ($V_{FINE}$), the control circuit 103 increments the intermediate digital control signal ($V_{INT}$) by one. The source circuit 206 then varies the fine digital control signal ($V_{FINE}$) to fine calibrate the frequency of the clock signal ($V_{CLK}$). Thus, for a temperature drift, the frequency of the clock signal ($V_{CLK}$) is adjusted by the sink and source circuits 204 and 206.

Further, during the fine calibration of the clock signal ($V_{CLK}$), incrementing the coarse digital control signal ($V_{COARSE}$) may cause an abrupt change in the frequency of the clock signal ($V_{CLK}$). The low-pass filter 228 smoothens the abrupt change in the frequency of the clock signal ($V_{CLK}$) by enabling a slow variation thereof. The structure and functioning of the low-pass filter 228 is well known in the art. Moreover, the low-pass filter 228 filters the noise transmitted by the sink circuit 204. In one embodiment of the present invention the low-pass filter 228 includes a by-pass switch (not shown) that disconnects the low-pass filter 228 when the by-pass switch is activated. During coarse calibration, the by-pass switch is deactivated and avoids the unwanted slow variation in the frequency of the clock signal ($V_{CLK}$). During fine calibration, the by-pass switch is activated and the low-pass filter is connected between the source and sink circuits to introduce slow variation in the frequency of the clock signal.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A digital-to-analog converter (DAC), comprising:
   a first transistor having a drain terminal for receiving a reference current, a gate terminal connected to the drain terminal thereof, and a source terminal connected to ground;
   a sink circuit for receiving a coarse digital control signal, connected to the gate terminal of the first transistor for receiving the reference current, and generating a bias current, the sink circuit including:
      a second transistor having a gate terminal connected to the gate terminal of the first transistor, a drain terminal for mirroring the reference current and generating a first sink current, and a source terminal connected to ground;
      a third transistor having a gate terminal connected to the gate terminal of the first transistor, a drain terminal for mirroring the reference current and generating a second sink current, and a source terminal connected to ground;
      a first switch for receiving the coarse digital control signal and connected to the drain terminal of the second transistor for receiving the first sink current, wherein the first sink current flows through the first switch based on the coarse digital control signal; and
      a second switch for receiving the coarse digital control signal and connected to the drain terminal of the third transistor for receiving the second sink current, wherein the second sink current flows through the second switch based on the coarse digital control signal, and wherein the bias current is equal to a sum of the first and second sink currents;
   a fourth transistor having a drain terminal connected to a gate terminal thereof and the sink circuit for receiving the bias current, and a source terminal connected to a supply voltage;
   a fifth transistor having a gate terminal connected to the gate terminal of the fourth transistor, a source terminal connected to the supply voltage for mirroring a first fraction of the bias current and generating a first source current; and
   a source circuit for receiving a fine digital control signal, connected to the gate terminal of the fourth transistor for receiving the bias current, mirroring a second fraction of the bias current, and generating an output current, the source circuit including:
      a sixth transistor having a gate terminal connected to the gate terminal of the fourth transistor, and a source terminal connected to the supply voltage for mirroring the second fraction of the bias current and generating a second source current;
      a seventh transistor having a gate terminal connected to the gate terminal of the fourth transistor, and a source terminal connected to the supply voltage for mirroring the second fraction of the bias current and generating a third source current;
      a third switch for receiving the fine digital control signal and connected to a drain terminal of the sixth transistor for receiving the second source current, wherein the second source current flows through the third switch based on the fine digital control signal; and
      a fourth switch for receiving the fine digital control signal and connected to a drain terminal of the seventh transistor for receiving the third source current, wherein the third source current flows through the fourth switch based on the fine digital control signal,
   wherein the output current is equal to a sum of the first through third source currents, and
   wherein the output current is output at a node that is formed by the drain terminal of the fifth transistor, and the third and fourth switches.

2. The DAC of claim 1, further comprising a low-pass filter connected between the gate terminals of the fourth and fifth transistors.

3. The DAC of claim 2, wherein the low-pass filter comprises:
a resistor connected between the gate terminals of the fourth and the fifth transistors; and
a capacitor connected between the gate terminal of the fifth transistor and the supply voltage.

4. The DAC of claim 1, wherein the DAC receives a decremented version of the coarse digital control signal when the fine digital control signal is less than a first threshold value, and the DAC receives an incremented version of the coarse digital control signal when the fine digital control signal is greater than a second threshold value.

5. The DAC of claim 1, wherein the second, third, sixth, and seventh transistors are binary weighted transistors.

6. The DAC of claim 1, wherein the first sink current is equal to the second sink current, and wherein the second source current is equal to the third source current.

7. The DAC of claim 1, wherein the first fraction of the bias current is greater than the second fraction of the bias current.

8. The DAC of claim 1, wherein the first through third transistors are n-channel metal-oxide semiconductor (NMOS) transistors and the fourth through seventh transistors are p-channel metal-oxide semiconductor (PMOS) transistors.

9. A clock and data recovery (CDR) circuit, comprising:
a phase-frequency detector (PFD) circuit for receiving an input signal, a clock signal, and a reference signal, and generating intermediate and fine digital control signals based on a frequency difference between a frequency of the reference signal and a frequency of the clock signal, and a phase difference between a phase of the input signal and a phase of the clock signal, respectively;
a digital-to-analog converter (DAC) for receiving a reference current, connected to the PFD circuit for receiving a coarse digital control signal and the fine digital control signal, and generating an output current, wherein the coarse digital control signal is at least one of the intermediate digital control signal, an incremented version of the intermediate digital control signal, and a decremented version of the intermediate digital control signal, the DAC including:
a first transistor having a drain terminal for receiving the reference current, a gate terminal connected to the drain terminal thereof, and a source terminal connected to ground;
a sink circuit for receiving the coarse digital control signal, connected to the gate terminal of the first transistor for receiving the reference current, and generating a bias current, the sink circuit including:
a second transistor having a gate terminal connected to the gate terminal of the first transistor, a drain terminal for mirroring the reference current and generating a first sink current, and a source terminal connected to ground;
a third transistor having a gate terminal connected to the gate terminal of the first transistor, a drain terminal for mirroring the reference current and generating a second sink current, and a source terminal connected to ground;
a first switch for receiving the coarse digital control signal and connected to the drain terminal of the second transistor for receiving the first sink current, wherein the first sink current flows through the first switch based on the coarse digital control signal; and
a second switch for receiving the coarse digital control signal and connected to the drain terminal of the third transistor for receiving the second sink current, wherein the second sink current flows through the second switch based on the coarse digital control signal, and wherein the bias current is equal to a sum of the first and second sink currents;
a fourth transistor having a drain terminal connected to a gate terminal thereof and the sink circuit for receiving the bias current, and a source terminal connected to a supply voltage;
a fifth transistor having a gate terminal connected to the gate terminal of the fourth transistor, a source terminal, connected to the supply voltage, for mirroring a first fraction of the bias current and generating a first source current; and
a source circuit for receiving the fine digital control signal, connected to the gate terminal of the fourth transistor for receiving the bias current, mirroring a second fraction of the bias current, and generating an output current, the source circuit including:
a sixth transistor having a gate terminal connected to the gate terminal of the fourth transistor, and a source terminal connected to the supply voltage for mirroring the second fraction of the bias current and generating a second source current;
a seventh transistor having a gate terminal connected to the gate terminal of the fourth transistor, and a source terminal connected to the supply voltage for mirroring the second fraction of the bias current and generating a third source current;
a third switch for receiving the fine digital control signal and connected to a drain terminal of the sixth transistor for receiving the second source current, wherein the second source current flows through the third switch based on the fine digital control signal; and
a fourth switch for receiving the fine digital control signal and connected to a drain terminal of the seventh transistor for receiving the third source current, wherein the third source current flows through the fourth switch based on the fine digital control signal,
wherein the output current is equal to a sum of the first through third source currents, and
wherein the output current is output at a node that is formed by the drain terminal of the fifth transistor, and the third and fourth switches;
a current-controlled oscillator connected to the node of the DAC for receiving the output current and generating the clock signal; and
a data sampler, for receiving the input signal, and connected to the current-controlled oscillator for receiving the clock signal, sampling the input signal at the frequency of the clock signal and generating a sampled output signal.

10. The CDR circuit of claim 9, further comprising a low-pass filter connected between the gate terminals of the fourth and fifth transistors.

11. The CDR circuit of claim 10, wherein the low-pass filter comprises:
a resistor connected between the gate terminals of the fourth and the fifth transistors; and
a capacitor connected between the gate terminal of the fifth transistor and the supply voltage.

12. The CDR circuit of claim 9, wherein the current-controlled oscillator is a ring oscillator.

13. The CDR circuit of claim 9, wherein the data sampler is a D flip-flop.

14. The CDR circuit of claim 9, wherein the PFD circuit further comprises:
- a frequency detector circuit for receiving the reference signal and connected to the current-controlled oscillator for receiving the clock signal and generating the intermediate digital control signal based on the frequency difference between the frequencies of the reference and clock signals;
- a phase detector circuit for receiving the input signal and connected to the current-controlled oscillator for receiving the clock signal and generating an early-late signal based on the phase difference between the phases of the input and clock signals; and
- a loop filter connected between the phase detector circuit and the DAC for receiving the early-late signal and generating the fine digital control signal based the early-late signal.

15. The CDR circuit of claim 14, the early-late signal indicates that the clock signal at least one of leads and lags the input signal.

16. The CDR circuit of claim 14, wherein the phase detector circuit is a non-linear phase detector.

17. The CDR circuit of claim 9, further comprising a control circuit, connected to the PFD circuit and the loop filter, that receives the intermediate and fine digital control signals and generates the coarse digital control signal.

18. The CDR circuit of claim 17, wherein the control circuit provides the decremented version of the intermediate digital control signal as the coarse digital control signal when the fine digital control signal is less than a first threshold value, and wherein the control circuit provides the incremented version of the intermediate digital control signal as the coarse digital control signal when the fine digital control signal is greater than a second threshold value.

19. The CDR circuit of claim 9, wherein the second, third, sixth, and seventh transistors are binary weighted transistors.

20. The CDR circuit of claim 9, wherein the first sink current is equal to the second sink current, and wherein the second source current is equal to the third source current.

21. The CDR circuit of claim 9, wherein the first fraction of the bias current is greater than the second fraction of the bias current.

22. The CDR circuit of claim 9, wherein the first through third transistors are n-channel metal-oxide semiconductor (NMOS) transistors, and the fourth through seventh transistors are p-channel metal-oxide semiconductor (PMOS) transistors.

* * * * *